United States Patent [19]

Covill

[11] Patent Number: 4,535,298
[45] Date of Patent: Aug. 13, 1985

[54] DRIVER CIRCUIT
[75] Inventor: Dennis H. Covill, Tantallon, Canada
[73] Assignee: Nautical Electronics Laboratories Limited, Nova Scotia, Canada
[21] Appl. No.: 549,479
[22] Filed: Nov. 7, 1983
[30] Foreign Application Priority Data
Nov. 17, 1982 [CA] Canada .................................. 415785
[51] Int. Cl.³ .............................................. H03F 3/68
[52] U.S. Cl. .................................. 330/189; 330/124 D; 330/148; 330/251; 330/269; 330/276; 330/295; 330/298
[58] Field of Search ..................... 330/207 P, 165–167, 330/124 D, 188, 189, 269, 276, 277, 148, 286, 295, 306, 298; 333/1, 25, 24 R

[56] References Cited
U.S. PATENT DOCUMENTS
3,605,031 9/1971 Tongue .......................... 330/295 X
4,117,415 9/1978 Hoover .......................... 330/269 X OTHER PUBLICATIONS
Harvey et al., "A 70 MHz Transistorized Transmit/Receive", *Radio Communication*, Feb. 1977, pp. 106–113.

Primary Examiner—James B. Mullins
Attorney, Agent, or Firm—John A. Baker

[57] ABSTRACT

The present invention relates to a driver circuit for use in connecting a source of RF drive voltage to a power amplifier stage. The driver is comprised of a transformer having a center tap, a first terminal connected to a first branch of the transformer and a second terminal connected to a second branch of the transformer. A first capacitor is connected between the source and the center tap. A second capacitor is connected across the first and second terminals. The first terminal is connected to the input of the amplifier and the dummy load is connected to the second terminal. The dummy load can be replaced by a second power amplifier stage having an input impedance similar to the input impedance of the first mentioned power amplifier.

17 Claims, 4 Drawing Figures

DRIVER CIRCUIT

The present invention relates to driving networks and particularly driving networks which drive power amplifier stages which under normal conditions present a high capacitive input impedance.

In order to obtain high power output transmitters using solid state devices it is known to gang a plurality of power amplifiers together so that the power of each amplifier adds at a single output terminal.

The advent of power field effect transistors, hereinafter power FET, has greatly enhanced the multiple ganged power amplifier field. Power amplifiers of the class D type can now be ganged together in, for example, a series connection to produce an efficient high power, RF output.

It is important when ganging multiple power stages together that when one stage fails the total output power is merely reduced and the transmitter continues to operate. This redundancy feature is a great advantage over conventional high power single ended transmitters since it allows the station to continue to function at a slightly reduced power.

Since class D amplifiers using Power FETs almost always fail in a short circuit condition, and since their outputs are constant voltage sources, the outputs can be series connected which avoids the necessity of an output isolator container network.

Class D amplifiers merely switch the dc power supply such that the output is a square wave at the RF frequency. As a result, after the various amplifying stages are ganged the high power signal must be passed through a low pass or band pass filter before connection to an antenna so as to produce a sinusoidal RF carrier.

Power FETs are commonly enhancement mode devices which require a bias of several volts to turn them from an OFF condition to a low impedance ON condition. The bias voltage must be positive for N channel devices and negative for P channel devices. The gate electrode is insulated from the device but has a relatively high capacitance to both the source and drain electrodes. A typical value of input capacitance for a typical power FET is in excess of 1000 picofarads.

In a typical class D amplifier the power FETs are driven at a zero volts mean gate bias and driven with a 7 to 10 volt RMS sinusoid. At higher frequencies a substantial reactive current will flow into the gate capacitance. This substantial current is a problem in that is precludes the use of a series resistor in the gate circuit for use as an isolator in the event of a power FET failure. A power FET almost always presents a very low shunt resistance in parallel with its normal input capacitance as a failed input impedance.

The present invention provides a circuit which interconnects the driving source with one or a plurality of power FET amplifiers so as to provide isolation between the driving source and the power amplifiers under failure conditions of any type. In addition, when more than one amplifier in ganged together the circuit of the present invention provides isolation between the inputs of the various amplifiers so that in the event of failure of one or more power amplifier stages, the remaining operative power stages receive their nominal drive signal.

It is advantageous to arrange the drive circuit as a tank circuit so that the necessary high drive current needed for power FET operation is provided from a drive source of relatively low power. Such a circuit requires a tuning inductance. It would be difficult and costly if each power amplifier required an inductor as part of its input circuit. The present invention provides a drive network which only requires one inductor to tune all the inputs of the various power FET amplifiers.

The circuit according to the invention lends itself most efficiently to combining power FET amplifier inputs in pairs. However, this is not an essential feature of the invention and the input of a single power amplifier can be connected to the network by using a dummy termination as will be described hereinbelow in detail.

An object of the present invention is therefore to provide a drive network which coherently connects one or more inputs of power amplifiers to a single drive source providing isolation between the inputs and the drive source under a failed condition of one or more amplifiers.

It is another object of the invention to coherently connect one or more inputs of power FET amplifier to a single drive source so that a tuned tank circuit results having only a single tunable inductor.

In accordance with an aspect of the invention there is provided a circuit for use in connecting a source of RF driving voltage to an amplifier input comprising a transformer having a center tap, a first terminal connected to a first branch of said transformer and a second terminal connected to a second branch of said transformer; a first capacitor connecting said source to said center tap; a second capacitor connecting said first and second terminals, wherein said first terminal is connected to the input of said amplifier; and a dummy load connected to said second terminal.

The invention will be described in detail hereinbelow with the aid of the accompanying drawings in which.

Figure 3:
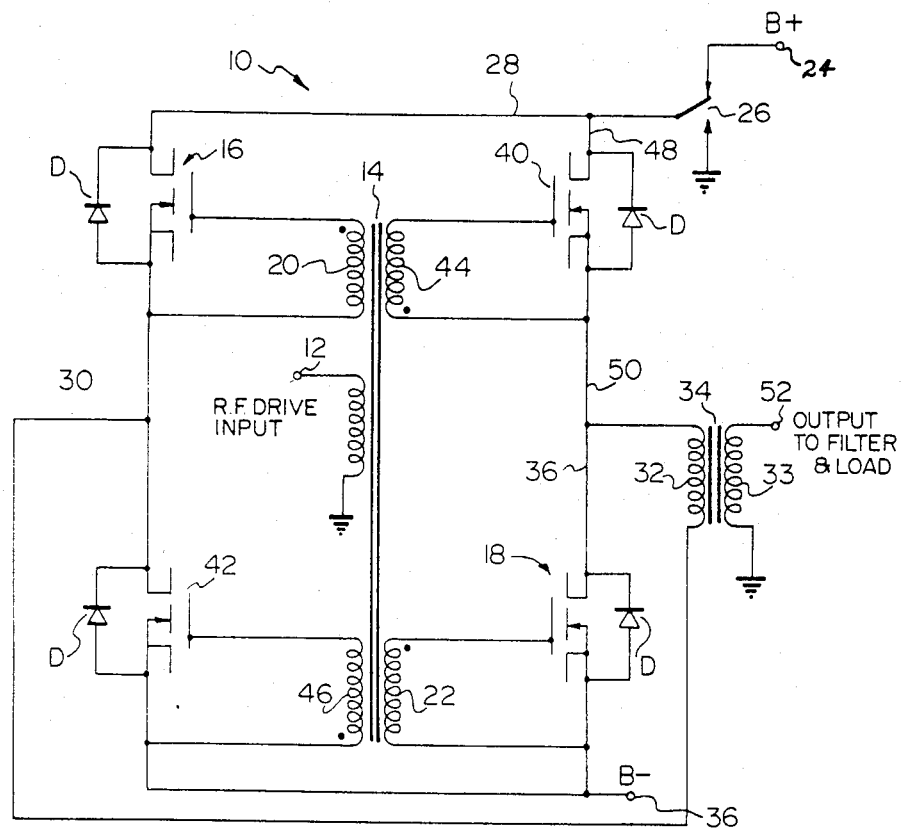
FIG. 3 is a schematic diagram of a typical 4 device power FET class D power amplifier capable of being driven by a circuit according to the present invention.

Referring to FIG. 3 there is shown a bridge push-pull class D amplifier 10 using power FET devices. Such a power amplifier stage or module can be driven by the circuit of the present invention, which would connect to terminal 12 of drive transformer 14. Typically the input voltage at terminal 12 is from 7 to 10 volts R. M. S. sinusoidal and at the carrier frequency desired. The positive going portion of the drive voltage simultaneously turns ON power FET devices 16 and 18 via windings 20 and 22 which are connected to the gates of the devices, respectively. The source and drain of devices 16 and 18 connect in a low impedance manner when turned ON and current flows from the B+ supply at terminal 24 through switch 26, wire 28, device 16, wire 30, the primary winding 32 of output transformer 34, wire 36, device 18 to the B− terminal 36. This induces a power pulse in one polarity direction in winding 33 of transformer 34. The negative going portion of the drive voltage turns OFF devices 16 and 18 and simultaneously turns ON devices 40 and 42 via winding 44 and 46 connected to the gate electrodes, respectively. As a result, current flows from B+ terminal 24 through switch 26, wire 48, device 40, wire 50, the primary winding 32 of output transformer 34, wire 30 and device 42 to the B− terminal 36. This induces a power pulse of the opposite polarity in winding 33 of transformer 34. A square wave high power signal at carrier frequency is therefore produced at output terminal 52. Power FET devices have, by virtue of their construction, diodes connected across the source/drain electrodes. However, for the sake of completeness, they are shown in FIG. 3 and marked D. In the event of a power amplifier failure, large voltages can be induced into primary winding 32 of transformer 34 by current flowing in the secondary winding from other power amplifiers connected in series. These large voltages are clipped by the diodes D by providing a current path.

Transformer 14 can be made almost ideal by virtue of ferrite cores and, as a result, the large input capacitance of the power FET devices 16, 18, 40 and 42 is reflected back to the drive input terminal 12. This capacitance for the sake of theoretical consideration is shown by capacitor $C_1$ in FIGS. 1 and 2 and has a value $X_{c1}$.

Figure 1:
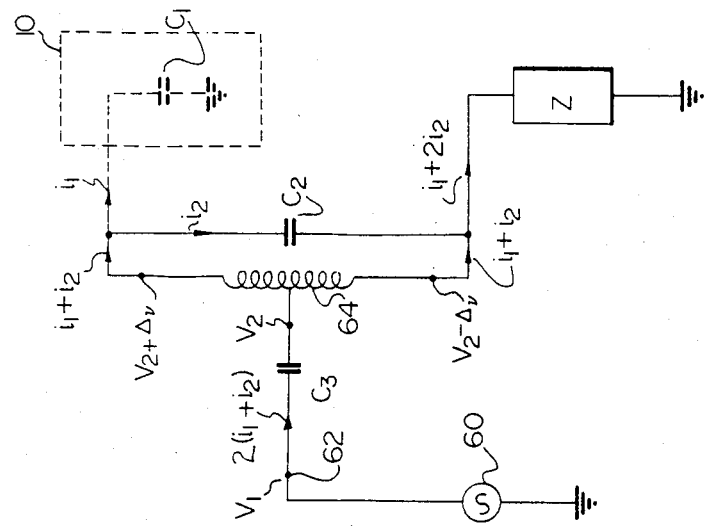
FIG. 1 is a schematic diagram of a circuit according to the invention connecting a single power FET power amplifier stage to a driving source.

The basic circuit is shown in FIG. 1. The hatched square is numbered 10 and represents the circuit shown in FIG. 3. An RF voltage source 60 produces the drive voltage necessary to drive power amplifier stages 10. The voltage source 60 produces a voltage $V_1$ at point 62 and feeds the center tap of a transformer 64 via a capacitor $C_3$. The transformer feeds, via one arm, amplifier 10 and, via its other arm, a dummy load having a generalized impedance Z. A capacitor $C_2$ is connected in parallel to the transformer arms. FIG. 1, for the purposes of circuit analysis shows the various currents flowing in the circuit. The transformer 64 is assumed to be ideal and under balanced conditions no net flux is circulating.

If it can be shown from the circuit analysis that the current $i_1$ flowing into power amplifier module 10 is independent of the impedance Z, isolation occurs. From FIG. 1, four basic circuit equations can be derived as follows.

$$V_2 + \Delta_v = i_1 \cdot X_{c1} \quad (1)$$

$$V_2 - \Delta_v = (i_1 + 2i_2)Z \quad (2)$$

$$2\Delta_v = i_2 \cdot X_{c2} \quad (3)$$

$$V_1 - V_2 = 2(i_1 + i_2)X_{c3} \quad (4)$$

Solving simultaneously for $i_1$ (1)-(2)

$$2\Delta_v = i_1 \cdot X_{c1} - (i_1 + 2i_2)Z$$

Substituting for $\Delta_v$ from (3)

$$i_1(X_{c1} - Z) = i_2(X_{c2} + 2Z)$$

Therefore $$\frac{i_1}{i_2} = \frac{X_{c2} + 2Z}{X_{c1} - Z} \text{ or } i_2 = i_1 \cdot \frac{(X_{c1} - Z)}{(X_{c2} + 2Z)} \quad (5)$$

$$(1) + (2) \ 2V_2 = i_1 \cdot X_{c1} + (i_1 + 2i_2)Z$$

Substituting for $i_2$ from (5)

$$2V_2 = i_1 \left[ X_{c1} + Z + 2Z \cdot \frac{(X_{c1} - Z)}{(X_{c2} + 2Z)} \right] \quad (6)$$

$$i_1 = \frac{2V_2}{X_{c1} + Z + 2Z \cdot \frac{(X_{c1} - Z)}{(X_{c2} + 2Z)}}$$

from (4) $V_2 = V_1 - 2(i_1 + i_2)X_{c3}$
Substituting for $i_2$ from (5)

$$V_2 = V_1 - 2X_{c3}\left[ i_1 + i_1 \cdot \frac{(X_{c1} - Z)}{(X_{c2} + 2Z)} \right]$$

Multiplying both sides by two and factoring $i_1$ from the right side:

$$2V_2 = 2V_1 - 4X_{c3} \cdot i_1 \left[ 1 + \frac{(X_{c1} - Z)}{(X_{c2} + 2Z)} \right]$$

Substituting from $V_2$ from (6)

$$i_1 \left[ X_{c1} + Z + 2Z \cdot \frac{(X_{c1} - Z)}{(X_{c2} + 2Z)} \right] =$$

$$2V_1 - 4X_{c3} \cdot i_1 \left[ 1 + \frac{(X_{c1} - Z)}{(X_{c2} + 2Z)} \right]$$

Rearranging $$2V_1 = i_1 \left[ X_{c1} + Z + 2Z \cdot \frac{(X_{c1} - Z)}{(X_{c2} + 2Z)} + 4X_{c3}\left[ 1 + \frac{(X_{c1} - Z)}{(X_{c2} + 2Z)} \right] \right]$$

Let $X_{c2} = 4X_{c3}$ $$2V_1 = i_1 \left[ X_{c1} + Z + 2Z \cdot \frac{(X_{c1} - Z)}{(X_{c2} + 2Z)} + X_{c2}\left[ 1 + \frac{(X_{c1} - Z)}{(X_{c2} + 2Z)} \right] \right]$$

$$2V_1 = i_1 \left[ X_{c1}Z + (X_{c2} + 2Z)\frac{(X_{c1} - Z)}{(X_{c2} + 2Z)} + X_{c2} \right]$$

$$2V_1 = i_1 (2X_{c1} + X_{c2})$$

Therefore:

$$i_1 = \frac{2V_1}{2X_{c1} + X_{c2}} \quad (7)$$

It can be seen from equation (5) that when Z, the impedance of the dummy load, is equal to the capacitance of the power amplifier module 10, the current $i_2$ through capacitor $C_2$ is zero. This shows that the circuit will be balanced if the dummy load is of the impedance $Z = X_{c1}$, and therefore the dummy load can be replaced by another power amplifier module 10. As a result, the circuit shown in FIG. 1 can drive two power amplifier modules. It should be noted that it is no problem to obtain power FETs with very similar input characteristics.

Equation (7) shows that the current $i_1$ entering power amplifier 10 is independent of the impedance Z when the capacitance of capacitor $C_2$ is four times the capacitance of the capacitor $C_3$. As a result, under this condition the arms of transformer 64 are isolated from one another, the circuit is balanced and no net flux circulates in the core of the transformer.

Figure 2:
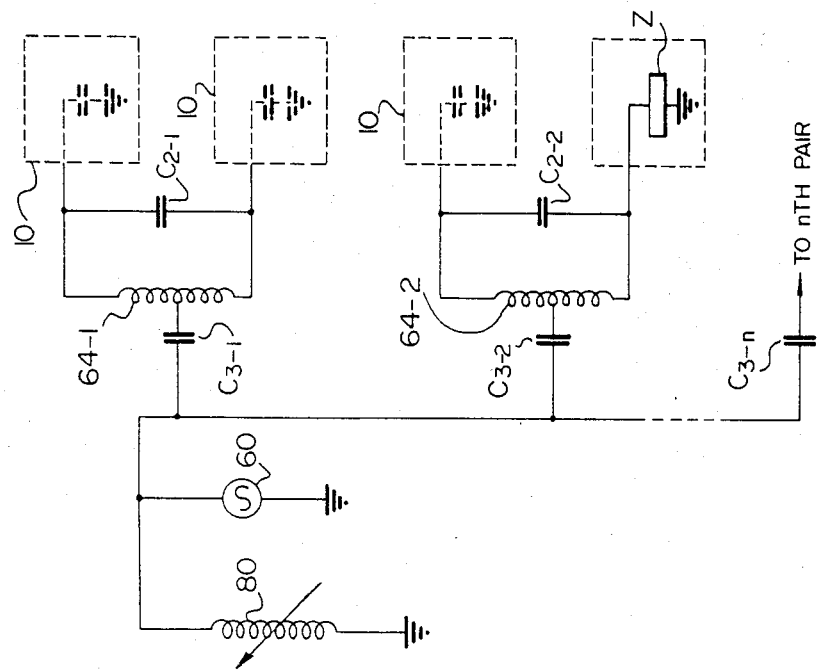
FIG. 2 is a schematic diagram of a circuit according to the present invention connecting a plurality of power FET power amplifiers to a single drive source.

FIG. 2 is a schematic diagram and is a logical expansion of the circuit shown in FIG. 1. The circuit in FIG. 2 can feed n pairs of power amplifier modules or power amplifier and dummy load combinations. A signal generator 60 provides the drive voltage. This drive voltage is fed to n pairs of power amplifiers or power amplifiers/dummy load combinations, via n coupling capacitors $C_{3-1}$, $C_{3-2}$, ..., $C_{3-n}$. Each coupling capacitor feeds the center tap of n transformers 64-1, 64-1, ..., 64-n. The arms of each transformer are shunted by n shunt capacitors $C_{2-1}$, $C_{2-2}$, ... $C_{2-n}$. FIG. 2 has been generalized for the sake of understanding the invention and shows one pair of power amplifiers connected in the first branch and the combination of a power amplifier paired with a dummy load of impedance Z connected in the second branch. For a balanced and isolated system the impedance of Z should equal the capacitance of the power amplifier module with which it is paired and $X_{c2-n}$ should equal $4X_{c3-n}$.

The capacitive input of all amplifier modules is reflected back through the hybrid transformers (64-1 etc.) and the series capacitors ($C_{3-1}$ etc.) to the voltage source 60 as one relatively large capacitance. Note that under the normal balanced condition, the hybrid transformer is electrically transparent. A variable inductor 80 can be connected in shunt with this capacitance and tuned with respect to that capacitance and the frequency of signal generator 60 to form a tank circuit. As a result, a large circulating tank current is induced sufficient to switch each of the power amplifier modules 10 without the signal generator 60 having to provide this entire current.

A single inductance can therefore be used to tune the entire circuit. This provides an economy of circuit components and an ease of tuning. In the event of the failure of one power amplifier module, the tank circuit will detune slightly. This does not present a problem in that all that is required is that the signal generator 60 be designed to provide a few percent more power than is nominally required.

The power amplifier modules 10 must all be fed in phase in order that the modules combine at their outputs to provide one high power signal. It can be seen that since pairs of power amplifier modules are all driven from a single source coherence is insured.

Figure 4:
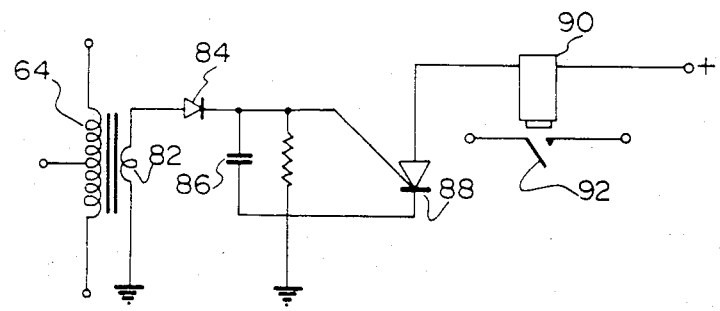
FIG. 4 is a circuit for use in conjunction with the circuit shown in FIGS. 1 and 2 to provide an indication of the failure of a power amplifier module.

The fact that under balanced operating conditions there is no net flux circulating in transformer 64 of FIG. 1 can be used to detect failure of a power amplifier module pair. The circuit to accomplish this is shown in FIG. 4. A secondary winding 82 is added to transformer 64. When a pair of power amplifier modules is operating normally there is no net flux circulating in transformer 64 and therefore there is no voltage developed across winding 82. As a result, the circuit shown in FIG. 4 is inoperative. When a module fails, a net flux is present in transformer 64 and a voltage having a frequency equal to the drive frequency is developed across winding 82. This voltage is rectified and filtered by diode 84, and capacitor 86 to provide sufficient DC power to energize SCR 88. When SCR 88 is turned ON, relay 90 operates to activate a switch or switches generally shown by switch 92. Such a switching arrangement can be used to provide a warning that a module pair has failed and that the transmitter is continuing to operate but at reduced power. The switching arrangement can also be used to deactivate the module pair that has failed by, for example, removing the B+ from the amplifier as is shown by switch 26 in FIG. 3.

I claim:

1. A circuit for use in connecting a source of RF driving voltage to an amplifier input comprising:
    a transformer having a center tap, a first terminal connected to a first branch of said transformer and a second terminal connected to a second branch of said transformer;
    a first capacitor connecting said source to said center tap;
    a second capacitor connecting said first and second terminals, wherein said first terminal is connected to the input of said amplifier; and
    a dummy load connected to said second terminal.

2. The circuit of claim 1 wherein $$X_{c3} = 4X_{c2}$$

where $X_{c3}$ is the capacitance of said first capacitor and $X_{c2}$ is the capacitance of said second capacitor.

3. The circuit of claim 2 wherein an inductor is connected in parallel with said source of driving voltage.

4. The circuit of claim 3 wherein the amplifier has an input capacitance of $X_{c1}$ and wherein said dummy load has an impedance of Z, wherein $$Z = X_{c1}.$$

5. The circuit of claim 4 wherein said first and second branches are arranged so that when $Z = X_{c1}$ no net flux circulates.

6. The circuit of claim 5 wherein a winding is provided in said transformer and wherein a signal voltage is induced in said winding when $X_{c1} \neq Z$; and wherein circuit means are provided for switching OFF said amplifier.

7. A circuit for use in connecting a source of driving voltage to n pairs of amplifier modules each having an input comprising:
    (a) n transformers, each having a first winding and a second winding, with one end of each winding connected together to form a center tap, the other end of each winding forming first and second terminals;
    (b) n coupling capacitors, wherein one coupling capacitor is connected between said source and the center tap of each of said n transformers in a one-to-one correspondence;
    (c) n shunt capacitors, wherein one shunt capacitor is connected between the first and second terminals of each of said n transformers in a one-to-one correspondence; wherein one of said n pairs of amplifier modules is each connected to said first and second terminals of said n transformers in a one-to-one correspondence.

8. The circuit of claim 7 wherein the capacitance of each of said n coupling capacitors is $X_{c3}$ and the capacitance of each of said n shunt capacitors is $X_{c2}$, and $X_{c3} = 4X_{c2}$.

9. The circuit of claim 8 wherein an inductor is connected in parallel across said source.

10. The circuit of claim 9 wherein each amplifier of said n pairs of amplifier modules has an input capacitance which is approximately equal.

11. The circuit of claim 9 wherein each of said n transformers has said first and second windings so arranged that no net flux circulates when each of said n pairs of amplifier modules has an input capacitance which is approximately equal.

12. The circuit of claim 11 wherein each of said n transformers has one additional winding which has a signal voltage induced therein only when the input capacitances of it associated pair of amplifier modules of said n pair of amplifier modules is unequal, wherein circuit means are connected to said additional winding for switching OFF said associated pair of amplifier modules, if and only if, said signal voltage is present.

13. A circuit for use in connecting a source of RF driving voltage to first and second amplifier inputs comprising:
a transformer having a center tap, a first terminal connected to a first branch of said transformer and a second terminal connected to a second branch of said transformer;
a first capacitor connecting said source to said center tap;
a second capacitor connecting said first and second terminals, wherein said first terminal is connected to said first amplifier input and said second terminal is connected to said second amplifier input wherein;

$$X_{c3} = 4X_{c2}$$

where $X_{c3}$ is the capacitance of said first capacitor and $X_{c2}$ is the capacitance of said second capacitor.

14. The circuit of claim 13 wherein an inductor is connected in parallel with said source of driving voltage.

15. The circuit of claim 13 wherein said first amplifier has an input capacitance of $X_{c1-1}$ and said second amplifier has an input capacitance of $X_{c1-2}$ and wherein $$X_{c1-1} = X_{c1-2}.$$

16. The circuit of claim 15 wherein a winding is provided in said transformer and wherein a signal voltage is induced in said winding when $X_{c1-1} \neq X_{c1-2}$; and wherein circuit means are provided for switching OFF said first amplifier and said second amplifier.

17. The circuit of claim 15 wherein said first and second branches are arranged so that when $X_{c1-1} = X_{c1-2}$ no net flux circulates.

* * * * *